(12) United States Patent
Li

(10) Patent No.: US 11,309,260 B2
(45) Date of Patent: Apr. 19, 2022

(54) CHIP ON FILM STRUCTURE AND DISPLAY DEVICE

(71) Applicant: HUIZHOU CHINA STAR OPTOELECTRONICS TECHNOLOGY CO., LTD., Huizhou (CN)

(72) Inventor: Xiaohua Li, Huizhou (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 322 days.

(21) Appl. No.: 16/615,180

(22) PCT Filed: Sep. 20, 2019

(86) PCT No.: PCT/CN2019/106878
§ 371 (c)(1),
(2) Date: Nov. 20, 2019

(87) PCT Pub. No.: WO2021/007950
PCT Pub. Date: Jan. 21, 2021

(65) Prior Publication Data
US 2021/0407931 A1    Dec. 30, 2021

(30) Foreign Application Priority Data
Jul. 16, 2019   (CN) .......................... 201910638637.6

(51) Int. Cl.
*H01L 23/00* (2006.01)
*G02F 1/1345* (2006.01)
*H01L 23/498* (2006.01)

(52) U.S. Cl.
CPC ........ *H01L 23/564* (2013.01); *G02F 1/13452* (2013.01); *H01L 23/4985* (2013.01)

(58) Field of Classification Search
None
See application file for complete search history.

(56) References Cited

U.S. PATENT DOCUMENTS

| | | | | |
|---|---|---|---|---|
| 2012/0327328 | A1* | 12/2012 | Kim | .................. G02F 1/133308 349/59 |
| 2015/0301391 | A1* | 10/2015 | Li | ..................... G02F 1/133308 349/58 |
| 2017/0141498 | A1* | 5/2017 | Ryu | ..................... H02G 11/003 |

FOREIGN PATENT DOCUMENTS

| CN | 103605222. | * | 2/2013 |
|---|---|---|---|
| CN | 103676285 A | | 3/2014 |
| CN | 103728747 A | | 4/2014 |
| CN | 105353549 A | | 2/2016 |
| CN | 106200165 A | | 12/2016 |

(Continued)

*Primary Examiner* — Ashok Patel
(74) *Attorney, Agent, or Firm* — Osha Bergman Watanabe & Burton LLP

(57) ABSTRACT

A chip on film structure and a display device including chip on film structure, the chip on film structure including a film substrate including a body area, a plurality of traces, and a bonding area at opposite ends of the film substrate; at least one chip, the chip disposed in the body area through bonding and electrically connected to the display panel through the plurality of traces and the bonding area; and a guiding member disposed at one end of the film substrate connected to the display panel and covering the bonding area.

8 Claims, 2 Drawing Sheets

(56) References Cited

FOREIGN PATENT DOCUMENTS

| CN | 107437555 A | 12/2017 |
|---|---|---|
| CN | 108761932 A | 11/2018 |
| JP | 2014206604 A | 10/2014 |

\* cited by examiner

CHIP ON FILM STRUCTURE AND DISPLAY DEVICE

FIELD OF INVENTION

The present invention relates to display technology, and more particularly to a chip on film structure and a display device including the chip on film structure.

BACKGROUND OF INVENTION

With rapid development of panel display industry, design of entire modules of display devices is becoming more and more extreme, wherein the display devices require a chip on film (COF) connected to a printed circuit board (PCB), and a display panel, so that signals on the PCB panel can be conducted to the display panel, and an image is controlled and generated.

The COF is in a curved state in the entire module assembly of display devices and forms a groove with a certain radius. In addition, a chip (IC) mounted on the COF is often at a lowest position of the groove due to gravity. A protective structure of the COF will not be designed for corrosion of COF in the design of conventional entire module. When the display panel is in a high humid environment or is cleaned, water droplets on a glass surface of the display panel are collected into large water droplets in a spherical shape and liquid surface is in a high potential energy state. When the liquid droplets gather more and more, the liquid droplets are in a certain critical state, a certain dynamic change is formed due to influence of the surface tension when the next liquid droplets are introduced, which causes the liquid to form a flow in order to balance the potential energy. When the liquid droplets flow into the COF bonding area, the COF substrate film is made of polyimide, which has certain water absorption characteristics. When the water absorption rate reaches saturation, the liquid accumulates in a bending area of the COF and corrodes the chip and the copper layer in the COF, resulting in poor screen display.

Technical Problem

When the display panel is in a high humid environment or is cleaned, when the liquid droplets on the glass surface of the display panel flow into the COF bonding area, the liquid accumulates and corrodes the chip and the copper layer in the COF, resulting in poor screen display.

SUMMARY OF INVENTION

Technical Solution

In order to solve the problem of chip on film (COF) corroded by accumulated liquid, which leads to poor screen display, the present invention proposes a COF structure and a display device thereof, which can effectively improve such problem by bonding a guiding member to a COF and directing the converging water away from the COF.

In order to solve the above technical problem, an aspect of an embodiment of the present invention provides a COF structure, the COF structure includes a film substrate including a body area, a plurality of traces, and a bonding area disposed at opposite ends of the film substrate; at least one chip disposed in the body area through bonding, and electrically connected to the display panel through the plurality of traces and the bonding area; and a guiding member disposed at one end of the film substrate connected to the display panel and covering the bonding area, wherein the COF structure is configured to guide liquid through the guiding member, thereby preventing the liquid from flowing into the bonding area and the body area.

In one of the embodiments, the guiding member is T-shaped.

In one of the embodiments, a length of a top to a bottom of the T-shaped guiding member is greater than a length of a vertical portion of the film substrate after bending.

In one of the embodiments, a length of a top to a bottom of the T-shaped guiding member is less than ⅓ of a length of the film substrate.

In one of the embodiments, material of the guiding member is one selected from the group consisting of polyethylene terephthalate, polybutylene terephthalate, and polyarylate.

In one of the embodiments, the guiding member and the film substrate are integrally bonded into one piece.

In one of the embodiments, a length of a lower portion of the T-shaped guiding member is greater than a length of a vertical portion of the film substrate after bending.

In one of the embodiments, a length of a lower portion of the T-shaped guiding member is less than ⅓ of a length of the film substrate.

Another aspect of the present invention provides a COF structure suitable for use in a display panel, the COF structure includes a film substrate including a body area, a plurality of traces, and a bonding area disposed at opposite ends of the film substrate; at least one chip disposed in the body area through bonding and electrically connected to the display panel through the plurality of traces and the bonding area; and a guiding member disposed at one end of the film substrate connected the display panel and covering the bonding area, wherein the guiding member is T-shaped and is integrally bonded with the film substrate into one piece, the COF structure is configured to guide liquid through the guiding member, thereby preventing the liquid from flowing into the bonding area and the body area.

In one of the embodiments, a length of a top to a bottom of the T-shaped guiding member is greater than a length of a vertical portion of the film substrate after bending.

In one of the embodiments, a length of a top to a bottom of the T-shaped guiding member is less than ⅓ of a length of the film substrate.

In one of the embodiments, material of the guiding member is one selected from the group consisting of polyethylene terephthalate, polybutylene terephthalate, and polyarylate.

Another aspect of the present invention provides a display device, the display device including a frame, a backlight module disposed in the frame, a display panel disposed above the backlight module and abutting the frame, a printed circuit board disposed on a side of the display panel away from the backlight module, and a COF structure connected to the printed circuit board and the display panel, wherein the COF structure includes a film substrate, a chip disposed on a surface of the film substrate, and a guiding member disposed at an end of the film substrate connected to the display panel.

In one of the embodiments, the film substrate further including a body area, a plurality of traces, and a bonding area positioned at opposite ends of the film substrate; wherein the chip is disposed in the body area through bonding and is electrically connected to the display panel through the plurality of traces and the bonding area, and the guiding member covers the bonding area, wherein the COF structure is configured to guide liquid through the guiding member, thereby preventing the liquid from flowing into the bonding area and the body area.

In one of the embodiments, the guiding member is T-shaped.

In one of the embodiments, a length of a top to a bottom of the T-shaped guiding member is less than ⅓ of a length of the film substrate.

In one of the embodiments, a length of a top to a bottom of the T-shaped guiding member is greater than a length of a vertical portion of the film substrate after bending.

In one of the embodiments, the guiding member and the film substrate are integrally bonded into one piece.

In one of the embodiments, material of the guiding member is one selected from the group consisting of polyethylene terephthalate, polybutylene terephthalate, and polyarylate.

In one of the embodiments, the display panel further includes a color filter substrate, a thin film transistor array substrate, and a liquid crystal layer disposed therebetween.

Beneficial Effect

Compared with the conventional art, a COF structure and a display device thereof of the present disclosure are integrally bonded by a guiding member and a COF, which directs the converging water away from the COF, thereby effectively improving the problems of COF corroded by accumulated liquid and poor screen display.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art can obtain the other drawings without any creative effort.

DETAILED DESCRIPTION OF EMBODIMENTS

Figure 1:
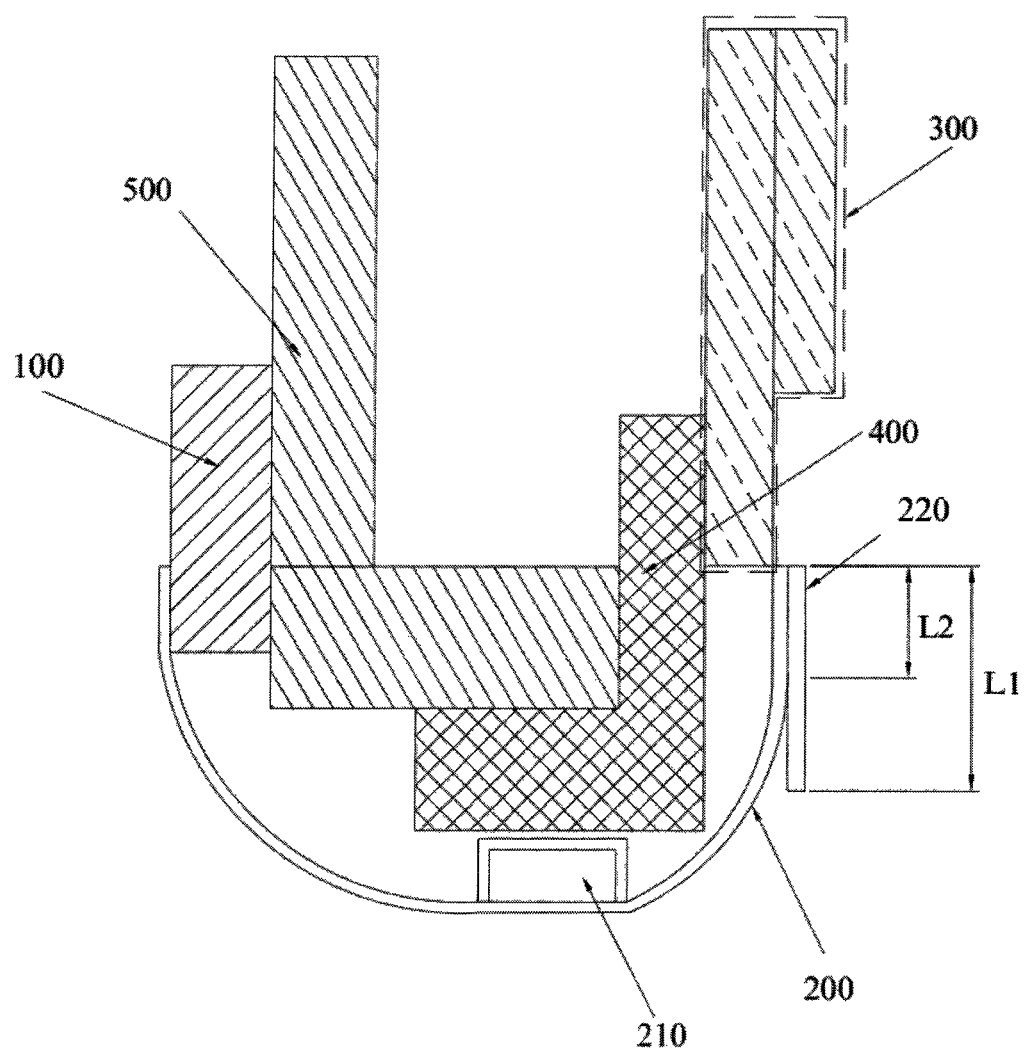
FIG. 1 is a schematic structural diagram of a display device according to an embodiment of the present invention.

The following description of each embodiment, with reference to the accompanying drawings, is used to exemplify specific embodiments which can be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

As shown in FIG. 1, FIG. 1 is a schematic structural diagram of a display device according to an embodiment of the present invention. The display device according to an embodiment of the present invention includes a frame 400, a backlight module 500 disposed in the frame 400, a display panel 300 disposed above the backlight module 500 and abutting the frame 400, and a printed circuit board 100 disposed on a side of the backlight module 500 away from the display panel 300; wherein the display device further includes a chip on film (COF) structure connected to the printed circuit board 100 and the display panel 300, the COF structure includes a film substrate 200, a chip 210 is disposed on a surface of the film substrate 200, and a guiding member 220 is disposed at an end of the film substrate 200 connected to the display panel 300.

Among them, the display panel 300 can not only abut against the frame 400 by mechanism design, but also adds adhesive materials and other ways to bond to the frame 400. The display panel 300 includes a color filter substrate, a thin film transistor array substrate, and a liquid crystal layer disposed between the color filter substrate and the thin film transistor array substrate. A polarizer can be disposed above the color filter substrate for polarizing light emitted from the backlight module 500. One end of the COF structure is electrically connected to the thin film transistor array substrate in the display panel 300 through a trace inside the film substrate 200 to provide gate driving signals for thin film transistors to be turned on or off, and data voltages of corresponding pixels.

Figure 2:
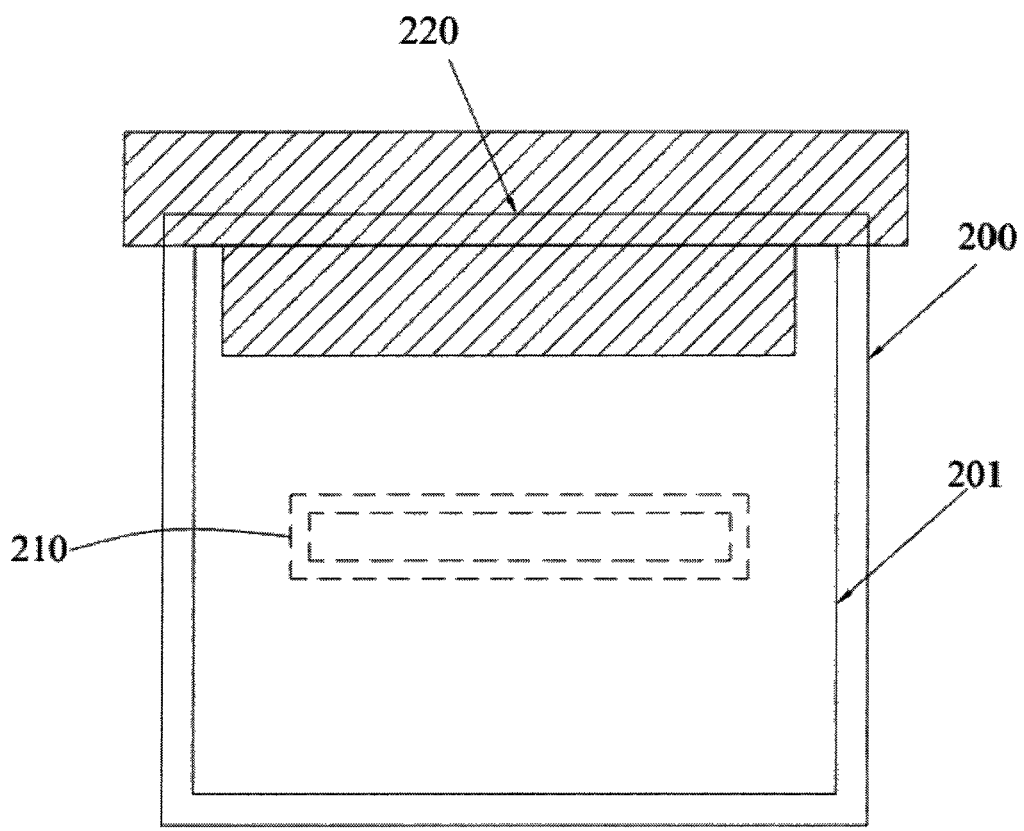
FIG. 2 is a schematic diagram of a chip on film structure according to an embodiment of the present invention.

In one embodiment, the COF structure is referred to both in FIG. 1 and FIG. 2, FIG. 2 is a schematic diagram of a COF structure according to an embodiment of the present invention. The COF structure is suitable for use in a display panel 300, wherein the COF structure includes a film substrate 200 having a body area 201, a plurality of traces, and two bonding areas at opposite ends of the film substrate. At least one chip 210, the chip is disposed in the body area 201 through bonding, and is electrically connected to the display panel through the plurality of traces and the bonding area; and the guiding member 220 is disposed on the film substrate 200 connected to one end of the display panel 300 and covers the bonding area, wherein the COF structure guides liquid through the guiding member 220, thereby preventing the liquid from flowing into the bonding area and the body area.

In a specific embodiment, the guide member 220 is shaped like a T-shape, as shown in FIG. 2, and also refer to FIG. 1, wherein a length of a top to a bottom of the T-shaped guiding member L1 is greater than a length of a vertical portion of the film substrate after bending L2, that is, according to a bending shape design of the film substrate 200 in a module, the length of a top to a bottom of the T-shaped guiding member L1 is less than ⅓ of the length of the film substrate in order to guide the liquid to a surface of the guide member 220.

In a specific embodiment, the material hardness of the guide member 220 is greater than that of the film substrate 200, such as polyethylene terephthalate (PET), polybutylene terephthalate (PBT), (PAR), polyarylate and polyarylate materials.

In a specific embodiment, the guiding member 220 and the film substrate 200 are integrally bonded into one piece.

As described above, when the entire module of display device is cleaned or in working environment has a high humidity, water droplets or cleaning liquid can easily flow along the surface of the display panel 300 to flow into the underlying related electronic components, especially the COF in the bending state which is highly corroded, causing a short circuit or other circuit failure, thereby affecting the operational stability and reliability of the product.

The present invention can change the path of the droplet flow on the one hand through the arrangement of the guiding member, and can guide the liquid away from the COF structure, so that no liquid is accumulated at the bending area of the COF structure to avoid corrosion. On the other hand, it can strengthen the bonding area of the film structure and make it difficult to peel off.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display device comprising a frame, a backlight module disposed in the frame, a display panel disposed above the backlight module and abutting the frame, a printed circuit board disposed on a side of the display panel away from the backlight module, and a chip on film structure connected to the printed circuit board and the display panel, wherein the chip on film structure comprises a film substrate, a chip disposed on a surface of the film substrate, and a guiding member disposed at an end of the film substrate connected to the display panel.

2. The display device according to claim 1, wherein the film substrate further comprising a body area, a plurality of traces, and a bonding area positioned at opposite ends of the film substrate; wherein the chip is disposed in the body area through bonding and is electrically connected to the display panel through the plurality of traces and the bonding area, and the guiding member covers the bonding area, wherein the chip on film structure is configured to guide liquid through the guiding member, thereby preventing the liquid from flowing into the bonding area and the body area.

3. The display device according to claim 1, wherein the guiding member is T-shaped.

4. The display device according to claim 3, wherein a length of a top to a bottom of the T-shaped guiding member is less than ⅓ of a length of the film substrate.

5. The display device according to claim 3, wherein a length of a top to a bottom of the T-shaped guiding member is greater than a length of a vertical portion of the film substrate after bending.

6. The display device according to claim 1, wherein the guiding member and the film substrate are integrally bonded into one piece.

7. The display device according to claim 1, wherein material of the guiding member is one selected from the group consisting of polyethylene terephthalate, polybutylene terephthalate, and polyarylate.

8. The display device according to claim 1, wherein the display panel further comprises a color filter substrate, a thin film transistor array substrate, and a liquid crystal layer disposed therebetween.

* * * * *